(12) United States Patent
Shu et al.

(10) Patent No.: US 10,048,999 B2
(45) Date of Patent: Aug. 14, 2018

(54) METHOD AND APPARATUS FOR OPTIMIZING RECOVERY OF SINGLE-DISK FAILURE

(71) Applicant: TSINGHUA UNIVERSITY, Beijing (CN)

(72) Inventors: Jiwu Shu, Beijing (CN); Zhirong Shen, Beijing (CN)

(*) Notice: Subject to any disclaimer, the term of this patent is extended or adjusted under 35 U.S.C. 154(b) by 48 days.

(21) Appl. No.: 14/980,571

(22) Filed: Dec. 28, 2015

(65) Prior Publication Data

US 2017/0091018 A1   Mar. 30, 2017

(30) Foreign Application Priority Data

Sep. 25, 2015   (CN) .......................... 2015 1 0623058

(51) Int. Cl.
  *G06F 11/00*   (2006.01)
  *G06F 11/07*   (2006.01)
  *H03M 13/15*   (2006.01)

(52) U.S. Cl.
  CPC ........ *G06F 11/0793* (2013.01); *G06F 11/079* (2013.01); *G06F 11/0727* (2013.01); *G06F 11/0751* (2013.01); *H03M 13/154* (2013.01)

(58) Field of Classification Search
  CPC .............. G06F 11/0793; G06F 11/0727; G06F 11/079; G06F 11/0751; H03M 13/154
  USPC ....................................................... 714/6.12
  See application file for complete search history.

(56) References Cited

U.S. PATENT DOCUMENTS

| | | | | |
|---|---|---|---|---|
| 8,326,669 | B2* | 12/2012 | Korupolu ............ | G06F 11/0793 705/7.11 |
| 2002/0062422 | A1* | 5/2002 | Butterworth ........ | G06F 11/0727 711/114 |
| 2010/0218037 | A1* | 8/2010 | Swartz .................... | G06F 17/30 714/6.12 |
| 2012/0330621 | A1* | 12/2012 | Detwiler ............. | G06F 17/5004 703/1 |
| 2015/0153187 | A1* | 6/2015 | Dong ..................... | G01C 21/30 701/446 |
| 2016/0211869 | A1* | 7/2016 | Blaum ................ | H03M 13/373 |
| 2017/0091018 | A1* | 3/2017 | Shu ..................... | G06F 11/0727 |

* cited by examiner

*Primary Examiner* — Yair Leibovich
(74) *Attorney, Agent, or Firm* — Wayne & Ken, LLC; Tony Hom

(57) ABSTRACT

The present invention discloses a method for optimizing recovery of a single-disk failure, including the following steps: obtaining, according to current load information, an amount of data expected to be read and an allowed number of iterations; obtaining a recovery optimization policy for failed data in each single stripe, and combining an initial recovery policy for multiple stripes; and further optimizing the initial recovery policy by using a greedy algorithm based on tabu search, subject to the amount of data expected to be read and the allowed number of iterations, to finally obtain an optimal recovery policy with a smallest quantity of seeks. The optimization method of the present invention reduces the amount of data to be read and the quantity of seek operations, and improves the efficiency of recovering a single-disk failure. The present invention further discloses an apparatus for optimizing recovery of a single-disk failure.

6 Claims, 10 Drawing Sheets

Obtaining, according to current load information of an erasure-coded storage system, an amount of data expected to be read and an allowed number of iterations; — S101

Obtaining a recovery optimization policy for failed data in each single stripe of multiple stripes, and combining the recovery optimization policy for the failed data in each single stripe to obtain an initial recovery policy for the multiple stripes; — S102

Further optimizing the initial recovery policy according to the amount of data expected to be read and the allowed number of iterations and by using a greedy algorithm based on a tabu search algorithm to obtain an optimal recovery policy with a smallest quantity of seeks, so that the single-disk failure is recovered according to the optimal recovery policy. — S103

METHOD AND APPARATUS FOR OPTIMIZING RECOVERY OF SINGLE-DISK FAILURE

CROSS-REFERENCE TO RELATED APPLICATIONS

This application is a continuation in part of, and claims priority to, Chinese Patent Application No. 201510623058.6 with a filing date of Sep. 25, 2015. The content of the aforementioned application, including any intervening amendments thereto, is incorporated herein by reference.

TECHNICAL FIELD

The present invention relates to the field of storage reliability technologies, and in particular, to a method and an apparatus for optimizing recovery of a single-disk failure.

BACKGROUND

In a storage system, an applied erasure code is mainly set by using two important parameters, namely, k and m. A (k, m) erasure code divides original data into k data strips (e.g., disk blocks), and encodes them into m parity strips, so that the original data can be recovered by a combination of any k data strips and parity strips. Because the erasure coding technology has relatively high storage efficiency, more and more storage systems use an erasure coding solution to ensure data reliability. In the erasure code, a set of k+m data strips and parity strips that determine a correlation depending on an erasure code constitutes a "stripe". Generally, the erasure-coded storage system can be logically seen as a combination of multiple stripes. A popular family of erasure code is called XOR-based erasure code, which performs encoding/decoding operations by using XOR operations only. In XOR-coded storage systems, a strip is further partitioned into many elements with equal-size, where element is the basic operated unit (e.g., a byte or a sector).

In the erasure-coded storage system, a main objective of optimizing recovery of a single-disk failure is to reduce an amount of read data (or called disk I/O) and achieve fast recovery.

However, in a disk, to read a needed amount of data, a magnetic head needs to be first rotated to a position where the data resides, and then read the data. A phase of magnetic head rotation and preparation before the needed data is read is generally called a "seek operation". Due to characteristics of the mechanical hard disk, the seek operation causes considerable latency, which is a bottleneck restricting a breakthrough for current random access performance of the disk. Conventional optimization on the single-disk failure recovery focuses on the reduction of data that needs to be read during failure recovery, but neglects a consequence that a quantity of seeks may be derived during the recovery optimization. The increasing quantity of seeks will prolong the recovery time. Therefore, it is a very important issue to pay close attention to the amount of data that needs to be read and the quantity of seek operations for recovering a single-disk failure.

Methods for optimizing recovery of a single-disk failure in related technologies can greatly reduce the amount of data read from surviving disks during the recovery, but still have a lot of disadvantages. For example, first, some methods for optimizing recovery of a single-disk failure are only applicable to a specific erasure code, for example, RDP code and X-code, both of which are typical RAID6 codes and can tolerate at most double disk failures, lacking universality; second, some methods for optimizing recovery of a single-disk failure have good universality, that is, the methods are applicable to any XOR-based erasure code, but finding an optimal recovery solution is an NP-hard problem; although an optimal solution for a homogeneous environment can be calculated and stored in advance, so that the failure of a single disk can be directly recovered by following the stored solution and reading a smallest amount of data, it needs to take a long calculation time to find an optimal recovery solution for a heterogeneous scenario with frequently changed system configurations, and therefore a single-disk failure cannot be handled efficiently in real time; third, some methods for optimizing recovery of a single-disk failure can find a near-optimal recovery solution in theory within polynomial time, but they only consider the scenario of a single stripe; however, an actual storage system should be a logically combination of multiple independent stripes after erasure coding, and therefore these methods have some limitations. In addition, most importantly, most methods for optimizing recovery of a single-disk failure in the related technologies do not consider the optimization of the seek operation and need further improvement.

SUMMARY

The present invention is intended to at least solve one of technical issues of the foregoing related technologies to some extent.

Therefore, one objective of the present invention is to provide a method for optimizing recovery of a single-disk failure. The method can optimize a quantity of seek operations and is characterized by simplicity and convenience.

Another objective of the present invention is to provide an apparatus for optimizing recovery of a single-disk failure.

To achieve the foregoing objective, in one aspect, an embodiment of the present invention provides a method for optimizing recovery of a single-disk failure, including the following steps: obtaining, according to current load information of an erasure-coded storage system, an amount of data expected to be read and an allowed number of iterations; obtaining a recovery optimization policy for failed data in each single stripe of multiple stripes, and combining the recovery optimization policy for the failed data in each single stripe to obtain an initial recovery policy for the multiple stripes; and further optimizing the initial recovery policy by using a greedy algorithm based on tabu search, subject to the amount of data expected to be read and the allowed number of iterations, to obtain an optimal recovery policy with a smallest quantity of seeks, so that the single-disk failure is recovered according to the optimal recovery policy.

In the method for optimizing recovery of a single-disk failure according to the embodiment of the present invention, an issue of single-disk failure recovery is considered in a multi-stripe condition; an amount of data read during failure recovery is optimized, and a quantity of seek operations generated during the recovery is also optimized. The method accelerates a process of recovering a single failed disk, improves efficiency of reconstructing the corrupted data, and has good universality, simplicity, and convenience, thereby better meeting a user requirement and improving user experience.

In addition, the method for optimizing recovery of a single-disk failure according to the foregoing embodiment of the present invention may further have the following additional technical features:

Further, in an embodiment of the present invention, the recovery optimization policy is to read data from a single stripe according to the amount of data expected to be read and a decoding rule of an erasure code to recover failed data in the single stripe.

Further, in an embodiment of the present invention, the step of further optimizing the initial recovery policy by using a greedy algorithm based on tabu search, subject to the amount of data expected to be read and the allowed number of iterations, to obtain an optimal recovery policy with a smallest quantity of seeks, includes: initializing a tabu list to an empty set, where the tabu list stores a quantity of seeks needed by an optimal solution that is found during each iteration; during each iteration, performing an input by using the optimal recovery solution in a last iteration as the initial recovery policy in the current iteration; and after the allowed number of iterations, selecting a solution with the smallest quantity of seeks from the tabu list to serve as the optimal recovery policy.

Further, in an embodiment of the present invention, if the amount of data needed by the optimal recovery policy is smaller than the amount of data expected to be read, data padding is performed.

Further, in an embodiment of the present invention, the quantity of seeks includes the number of magnetic head rotations and preparations before the data is read, and the single stripe is a set of multiple data strips and corresponding parity strips generated by an erasure code.

In another aspect, an embodiment of the present invention provides an apparatus for optimizing recovery of a single-disk failure, including: an obtaining module, configured to obtain, according to current load information of an erasure-coded storage system, an amount of data expected to be read and an allowed number of iterations; a combining module, configured to obtain a recovery optimization policy for failed data in each single stripe of multiple stripes, and combine the recovery optimization policy for the failed data in each single stripe to obtain an initial recovery policy for the multiple stripes; and an optimizing module, configured to further optimize the initial recovery policy by using a greedy algorithm based on tabu search, subject to the amount of data expected to be read and the allowed number of iterations, to obtain an optimal recovery policy with a smallest quantity of seeks, so that the single-disk failure is recovered according to the optimal recovery policy.

In the apparatus for optimizing recovery of a single-disk failure according to the embodiment of the present invention, an issue of single-disk failure recovery is considered in a multi-stripe condition; an amount of data read during failure recovery is optimized, and a quantity of seek operations generated during the recovery is also optimized. The apparatus accelerates a process of recovering a single-disk failure, improves efficiency of recovering the single-disk failure, and has good universality, simplicity, and convenience, thereby better meeting a user requirement and improving user experience.

In addition, the apparatus for optimizing recovery of a single-disk failure according to the foregoing embodiment of the present invention may further have the following additional technical features:

Further, in an embodiment of the present invention, the recovery optimization policy is to read data from a single stripe according to the amount of data expected to be read and a decoding rule of an erasure code to recover failed data in the single stripe.

Further, in an embodiment of the present invention, the optimizing module is further configured to: initialize a tabu list to an empty set, wherein the tabu list stores a quantity of seeks needed by an optimal solution that is found during each iteration; during each iteration, perform an input by using the optimal recovery solution in a last iteration as the initial recovery policy in the current iteration; and after the allowed number of iterations, select a solution with the smallest quantity of seeks from the tabu list to serve as the optimal recovery policy.

Further, in an embodiment of the present invention, if the amount of data needed by the optimal recovery policy is smaller than the amount of data expected to be read, data padding is performed.

Further, in an embodiment of the present invention, the quantity of seeks includes the number of magnetic head rotations and preparations before the data is read, and the single stripe is a set of multiple data strips and corresponding parity strips generated by an erasure code.

The additional aspects and advantages of the present invention will be provided in the following descriptions, and some of them will become more apparent in the following descriptions or be understood through the practice of the present invention.

BRIEF DESCRIPTION OF DRAWINGS

The foregoing and/or additional aspects and advantages of the present invention will become more apparent and understandable in descriptions of the embodiments in combination with the accompanying drawings, where.

DESCRIPTION OF EMBODIMENTS

Figure 1:
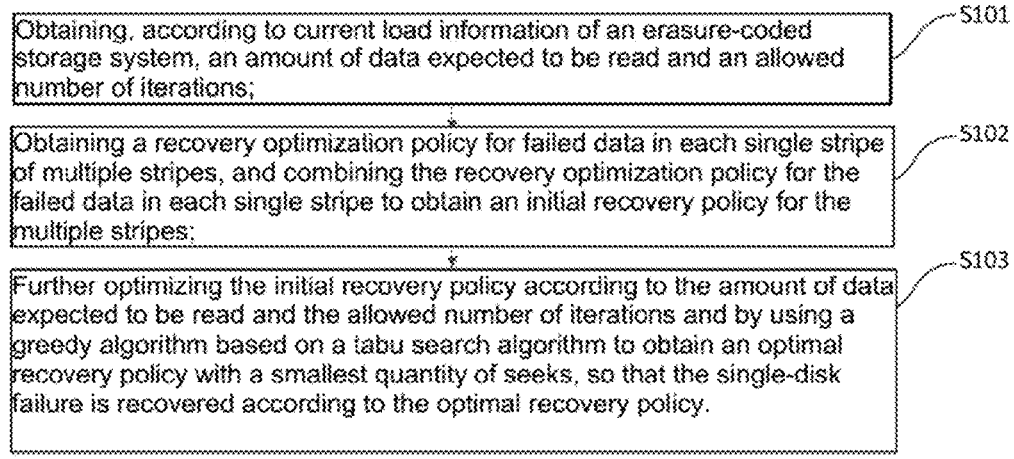
FIG. 1 is a flowchart of a method for optimizing recovery of a single-disk failure according to an embodiment of the present invention.

The following describes embodiments of the present invention in detail. Examples of the embodiments are illustrated in the accompanying drawings, where identical or similar numbers always represent identical or similar components or components having identical or similar functions. The following embodiments described with reference to the accompanying drawings are exemplary only and are only intended to explain the present invention and should not be understood as limitations on the present invention.

In addition, terms "first" and "second" are used only for description purposes and should not be understood as an indication or implication of relative significance or as an implicit indication of a technical feature quantity. Therefore, a feature defined with "first" and "second" may implicitly or explicitly include one feature or more features. In the description of the present invention, "multiple" means two or more unless otherwise defined.

In the present invention, unless otherwise specified and defined, terms "installation", "interconnection", "connection", and "fixing" should be understood in a broad sense, for example, the connection may be a fixed connection, a detachable connection, or an integrated connection, may be a mechanical connection or an electrical connection, may be a direct connection or a connection through an intermediate medium, or may be an internal connection between two components. A person of ordinary skill in the art may understand specific meanings of the foregoing terms in the present invention according to actual situations.

In the present invention, unless otherwise specified and defined, that a first feature is "above" or "below" a second feature may include that the first feature and the second feature are in direct contact, or may include that the first feature and the second feature are not in direct contact but come into contact through an additional feature between the first feature and the second feature. In addition, that the first feature is "above", "over", or "on the top of" the second feature includes that the first feature is directly above and obliquely above the second feature or only indicates that the level of the first feature is higher than that of the second feature. That the first feature is "below", "under", or "at the bottom of" the second feature includes that the first feature is directly under and obliquely under the second feature or only indicates that the level of the first feature is lower than that of the second feature.

The following first briefly describes significance of single-disk failure recovery before describing the method and the apparatus for optimizing recovery of a single-disk failure according to embodiments of the present invention.

With constant expansion of a data storage scale, a quantity of disks required for storing data in a storage system increases continuously, and a single disk failure has become a common thing. To ensure reliability of data, an existing mainstream solution adopts two modes: backup and erasure coding. Backup is to replicate data into N copies, store the N copies in different physical devices, and select one copy from the remaining data backup for recovery in case of a single data failure. Although this mode can tolerate up to N−1 data failures, a high storage overhead is easily caused. The storage overhead is N times that of original data. Compared with the backup, the erasure coding has a lower storage overhead. The erasure code is mainly set by using two important parameters, namely, k and m. A (k, m) erasure code divides original data into k data strips, and encodes them into m parity strips, so that the original data can be recovered by a combination of any k strips. Because the erasure coding technology has relatively higher storage efficiency, more and more storage systems implement erasure coding to ensure data reliability. In the erasure code, a set of k+m data strips and parity strips that determine a correlation depending on an erasure coding mechanism constitutes a "stripe". Generally, the erasure-coded storage system can be logically seen as a combination of multiple stripes.

As in-depth researches are performed on disk failures, a lot of different surveys and researches show that, of all disk failure events, single-disk failure events account for over 90%. At the same time, disk failures may have a correlation, that is, a failure of one disk may cause a failure of another disk. Therefore, it is particularly important to optimize recovery of a single-disk failure.

However, most of methods for optimizing recovery of a single-disk failure in related technologies have certain defects, for example, lack of universality, having limitations, not capable of handling a single-disk failure efficiently in real time, and in particular, not considering optimization of seek operations, hence easily reducing user experience.

Based on the foregoing issues, the present invention provides a method for optimizing recovery of a single-disk failure and an apparatus for optimizing recovery of a single-disk failure.

The following describes, with reference to the accompanying drawings, the method and apparatus for optimizing recovery of a single-disk failure according to embodiments of the present invention. The method for optimizing recovery of a single-disk failure according to an embodiment of the present invention is first described with reference to an accompanying drawing. Referring to FIG. 1, the optimization method includes the following steps:

S101. Obtain, according to current load information of an erasure-coded storage system, an amount of data expected to be read and an allowed number of iterations.

It should be understood that in an embodiment of the present invention, step S101, that is, data encoding, distribution, and storage, needs to be first performed. For example, step S101 may include the following steps:

S1.1. Select, according to a reliability requirement of the system and a storage overhead acceptable to the system, an erasure coding solution meeting the fault tolerance requirement and storage efficiency of the system.

S1.2. Divide data to be encoded, into data strips of a fixed size according to the setting of the erasure code.

S1.3. Encode the data strips according to an encoding rule of the erasure code, and generate parity strips.

S1.4. Distribute the generated data strips and parity strips to different disks for storage.

Figure 2:
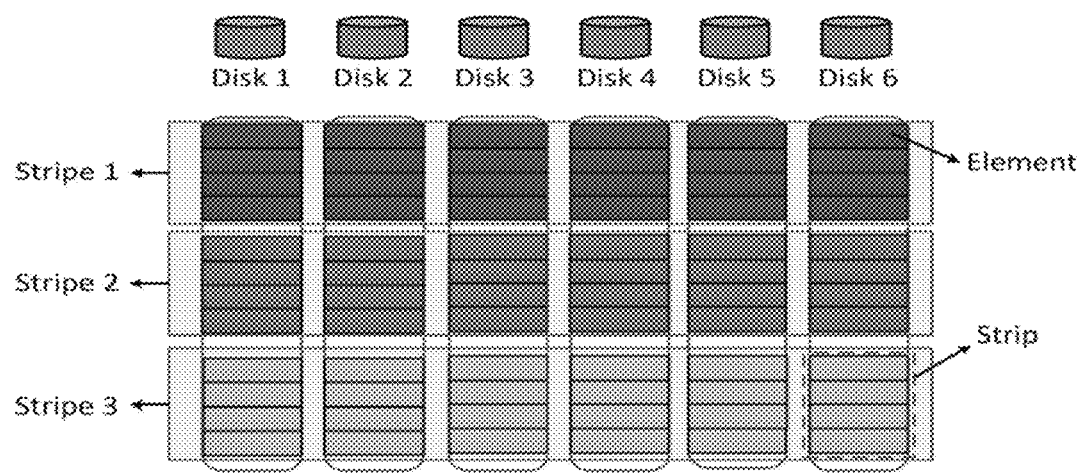
FIG. 2 is a schematic logic diagram of a storage system after erasure coding according to an embodiment of the present invention.
Figure 3:
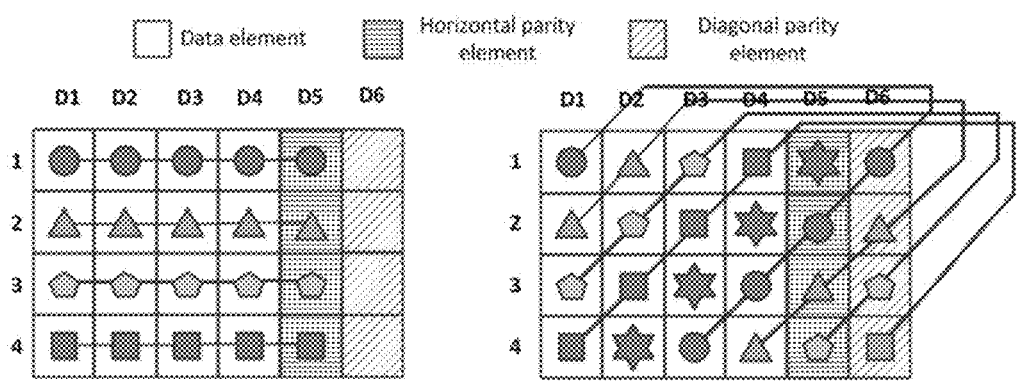
FIG. 3 is a schematic diagram of encoding of an RDP code (a single stripe) according to an embodiment of the present invention.

Specifically, first, a corresponding erasure coding mechanism is provided for the system according to the fault tolerance requirement and storage efficiency of the system. For example, if the system requires tolerating one disk failure, RAID5 may be selected for use. If the system requires tolerating double disk failures, a corresponding RAID6 code may be selected; and if the fault tolerance requirement is m>3, a Reed-Solomon code is used. Second, the stored data is encoded according to the encoding mechanism of the selected erasure code: The data is divided into data strips of an equal size; then corresponding data strips are input according to the encoding rule of the selected erasure code, and parity strips are generated; and finally, the data strips and the parity strips are stored according to the rule of the erasure code. Referring to FIG. 2, FIG. 2 is a schematic logic diagram of a storage system after erasure coding, where one storage system can be logically seen as a combination of multiple stripes. Further, referring to FIG. 3, FIG. 3 is a schematic diagram of encoding of a common RAID6 code, that is, an RDP code, where two types of parity strips are stored in the last two columns, and different types of parity strips have different encoding calculation modes. An RDP code has two types of parity chains, i.e., horizontal parity chains and diagonal parity chains. Each parity chain is composed of a parity element and the corresponding elements to generate that parity element.

After step S101 is performed, in the embodiment of the present invention, the amount of data expected to be read and the allowed number of iterations may be first obtained according to the current load information of the erasure-coded storage system.

S102. Obtain a recovery optimization policy for failed data in each single stripe of multiple stripes, and combine the recovery optimization policy for the failed data in each single stripe to obtain an initial recovery policy for the multiple stripes.

Further, in an embodiment of the present invention, the recovery optimization policy is to read data from a single stripe according to the amount of data expected to be read and a decoding rule of the erasure code to recover failed data in the single stripe. That is, data is read from the stripe selectively by using a current method for optimizing recovery of a single stripe and according to the decoding rule of the erasure code, and the read data is used to recover failed data in the single stripe.

Specifically, when a single-disk failure occurs, step S102 is performed to find an initial solution for recovering a single-disk failure. For example, step S102 may include the following steps:

S2.1. When a single-disk failure occurs, provide, according to the current load status, the amount of data expected to be read during the recovery.

S2.2. Obtain, according to a current method for optimizing recovery of a single stripe, a solution for optimizing recovery of failed data in each stripe. A working principle of the optimization solution is that data is read from the stripe selectively according to the decoding rule of the erasure code, and the read data is used to recover the failed data in the stripe. By using the method for optimizing recovery of a single stripe, a near-optimal solution for recovering a single stripe may be found within polynomial time.

Figure 4:
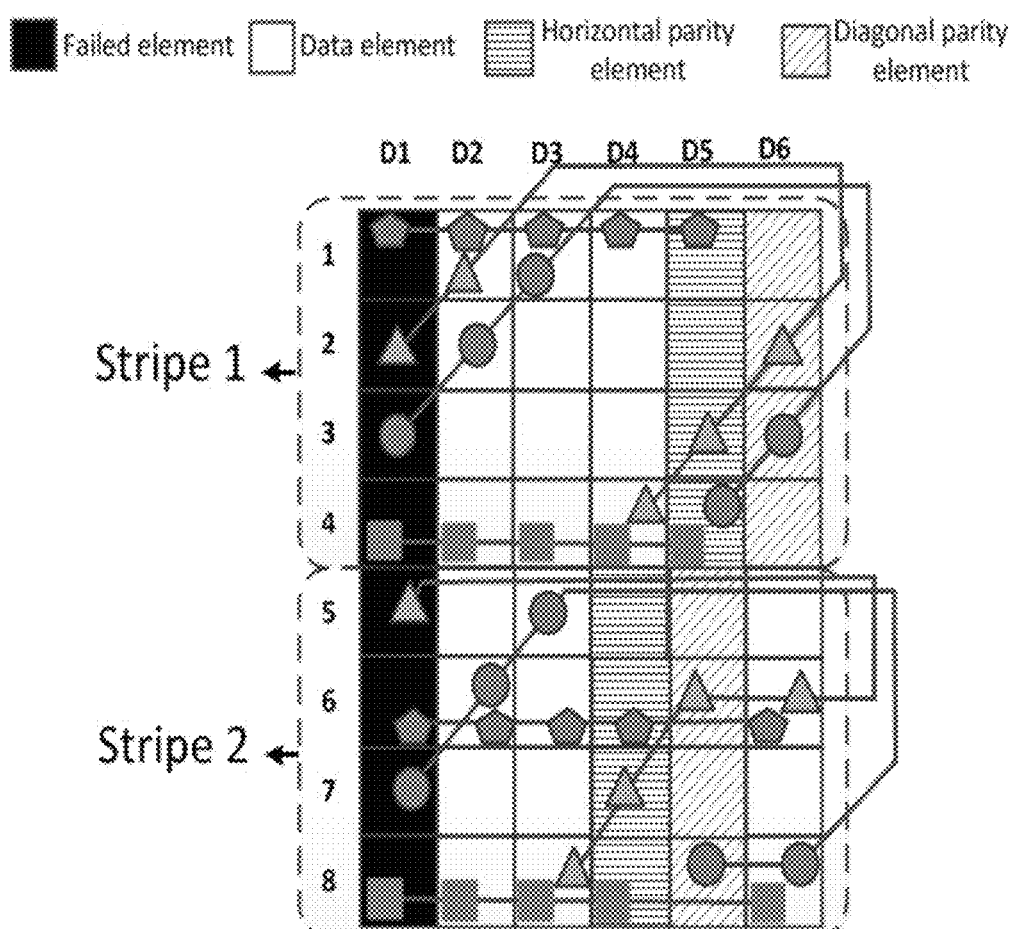
FIG. 4 is a schematic diagram of an initial recovery policy of two stripes constructed over an RDP code according to an embodiment of the present invention.

S2.3. Combine recovery solutions found for each stripe into a multi-stripe recovery solution, that is, the initial recovery policy. The recovery solution meets a limitation of an I/O size set by the system. Referring to FIG. 4, FIG. 4 is a schematic diagram of an initial recovery policy of two stripes constructed over an RDP code, where each stripe has a recovery solution to selectively read surviving data for recovering the lost data of that stripe. In practice, as the disk hosting parity elements will usually serve the heavy updates when the associated data elements are written, multiple stripes are usually organized by the stripe rotation for load balancing (i.e., gradually shifting the elements to left when the stripe identity increases).

S103. Further optimize the initial recovery policy by using a greedy algorithm based on tabu search, subject to the amount of data expected to be read and the allowed number of iterations, to obtain an optimal recovery policy with a smallest quantity of seeks.

Further, in an embodiment of the present invention, the step of further optimizing the initial recovery policy by using a greedy algorithm based on tabu search, subject to the amount of data expected to be read and the allowed number of iterations, to obtain an optimal recovery policy with a smallest quantity of seeks, includes: initializing a tabu list to an empty set, where the tabu list stores a quantity of seeks needed by an optimal solution that is found during each iteration; during each iteration, performing an input by using the optimal recovery solution in last iteration as the initial recovery policy in this iteration; and after the allowed number of iterations, selecting, from the tabu list, a solution with the smallest quantity of seeks as the optimal recovery policy.

In an embodiment of the present invention, if the amount of data needed by the optimal recovery policy is smaller than the amount of data expected to be read, data padding is performed.

Further, in an embodiment of the present invention, the quantity of seeks includes the number of magnetic head rotations and preparations before the data is read, and the single stripe is a set of multiple data strips and corresponding parity strips generated by an erasure code.

Specifically, the foregoing initial recovery policy optimizes only the amount of data read during the recovery, but does not consider optimizing the quantity of seek operations. Therefore, step S103 is performed to optimize the initial solution for recovering a single-disk failure. For example, step S103 may include the following steps:

S3.1. Determine, according to the current load status, the number of iterations t allowed by the algorithm.

S3.2. Initialize a tabu list £ to an empty set according to a tabu search algorithm, where the tabu list stores a quantity of seeks needed by an optimal solution that is found during each iteration. If the quantity of seeks needed by an interim recovery solution attempted in subsequent iterations is within the tabu list, the interim recovery solution is not considered in this iteration. The tabu list is used to avoid using a local optimal recovery solution that is previously found and to guide the search process toward a global optimal recovery solution.

S3.3. In each iteration, perform an input by using the optimal recovery solution $R_{int}$ in last iteration as the initial recovery policy in this iteration, where $R_{int}$ is initialized to a combination of solutions for recovering a single stripe found in step S102, which may specifically include the following steps:

S3.3.1. Calculate the quantity $q(R_{int})$ of seek operations brought about by the initial recovery solution, where the q(•) function is used to calculate the quantity of seeks needed by a given recovery solution.

S3.3.2. Because each parity element in a XOR-based erasure code is generated based on a part of data elements, a correlation between the parity element and some data elements is established. This correlation is denoted as a "parity chain" that includes the parity element and the elements needed to generate the parity element. It may be concluded, according to the encoding rule of the erasure code, that one data element may participate in generation of multiple parity elements, that is, one data element may join multiple parity chains. Therefore, in this step, for each failed element in each stripe, an attempt is made to use each possible parity chain of the failed element for recovery, and in each attempt, a new interim recovery solution R' may be generated, where R' includes a set of parity chains used for recovering all failed elements.

S3.3.3. Calculate an amount of data that needs to be read by the recovery solution R'. If the amount of data needed by this solution exceeds the amount of data that the system allows to read, it is necessary to re-optimize the solution in terms of the amount of read data to ensure that the amount of data read by the solution is not greater than the amount of data that the system allows to read. In this optimization process, each stripe may be optimized by using an existing method for optimizing recovery of a single stripe, so that a solution after the optimization can meet the limitation of the amount of data read during the recovery. If the amount of data needed by the solution is not greater than the amount of data that the system allows to read, the process enters the data padding phase.

S3.3.4. Data padding is a mode used to optimize the quantity of seek operations brought about by the recovery solution on a premise that the amount of data that the system allows to read is met. The specific practice of the data padding is as follows: Data distribution D' needed by the recovery solution is first obtained. In this data distribution, a physical interval of data requested in each disk is analyzed. If physical locations of two data elements that are requested in an adjacent sequence are discontinuous, an additional seek operation needs to be performed to read the two data elements. Therefore, if data in the physical interval is read along with the two data elements, one seek operation is reduced. Based on this idea, to minimize the quantity of seek operations, physical intervals caused by the data distribution of the solution are arranged in ascending order. Therefore, in the recovery solution after the data padding, not only data needed by the recovery solution is read, but also data is read from the arranged physical intervals in ascending order. In addition, it is ensured that the total amount of read data is not greater than the amount of data that the system allows to read. In the embodiment of the present invention, the recovery solution after the padding is marked as F'.

S3.3.5. Record the quantity q(F') of seek operations in the data distribution after the padding. If q(F')∈£, it indicates that the quantity of seeks was used as the quantity of seeks in the local optimal solution and recorded in £, and therefore this solution is skipped. If q(F')∉£ and q(F')<q($R_{ini}$), the current optimal recovery solution $R_{ini}$ is replaced with R', and the current optimal quantity q($R_{ini}$) of seeks is changed to q(F').

S3.3.6. After an attempt is made to recover each failed element by using all possible parity chains, insert the recorded current optimal quantity q($R_{ini}$) of seeks in the tabu list £, and enter a next iteration by using the currently found optimal recovery solution $R_{ini}$ as the initial recovery solution.

S3.4. After the algorithm undergoes the number of iterations given by the system, select, from the tabu list, a solution with the smallest quantity of seeks as the final optimal recovery solution, and recover the single-disk failure according to the recovery solution.

Figure 5:
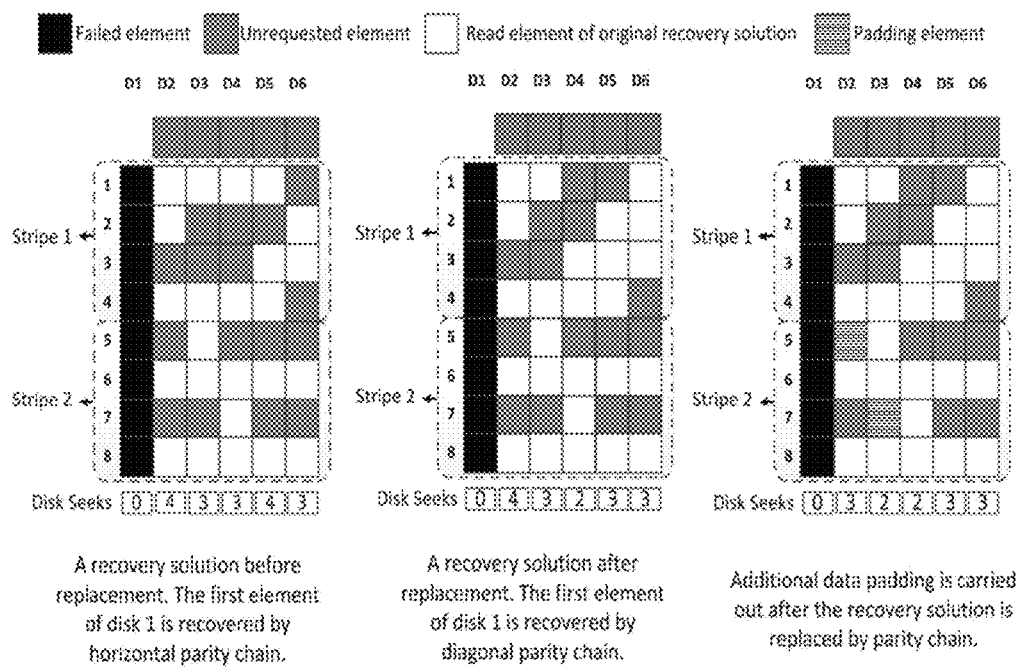
FIG. 5 is a schematic diagram of parity chain replacement after data padding is performed according to an embodiment of the present invention (assuming that a quantity of data elements that the system allows to read is 27 and the system selects an RDP code for fault tolerance)
Figure 6A:
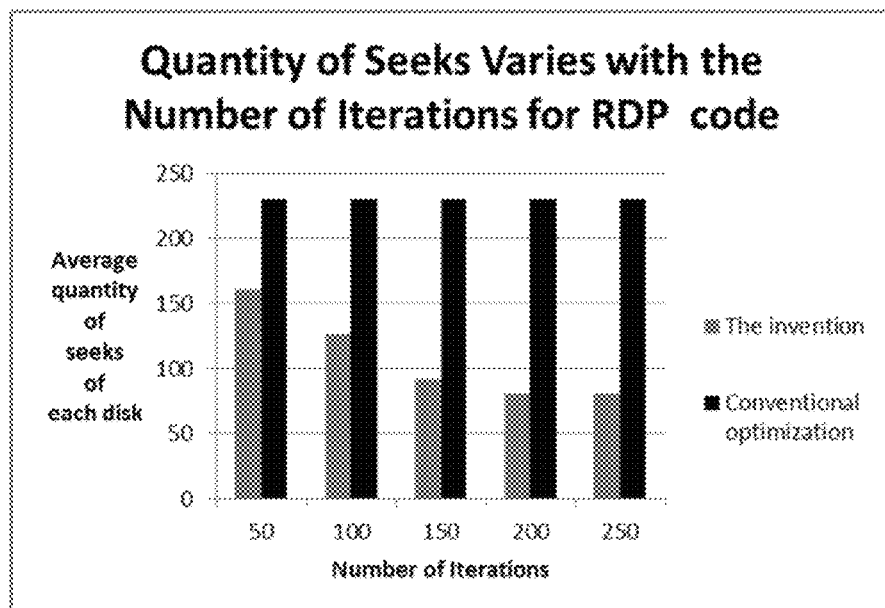
FIGS. 6a, b, c and d are schematic diagrams showing how a quantity of seeks varies with the number of iterations according to an embodiment of the present invention.
Figure 6B:
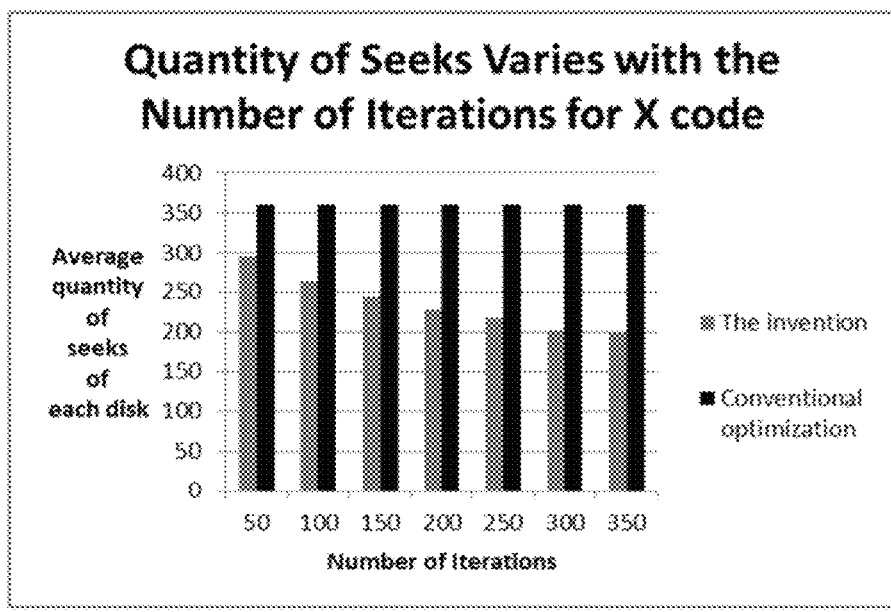
Figure 6C:
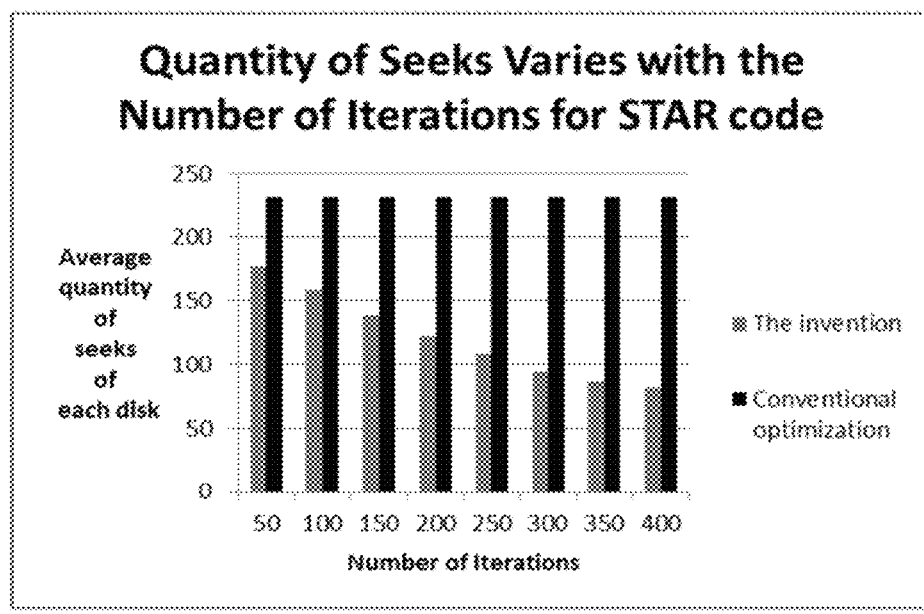
Figure 6D:
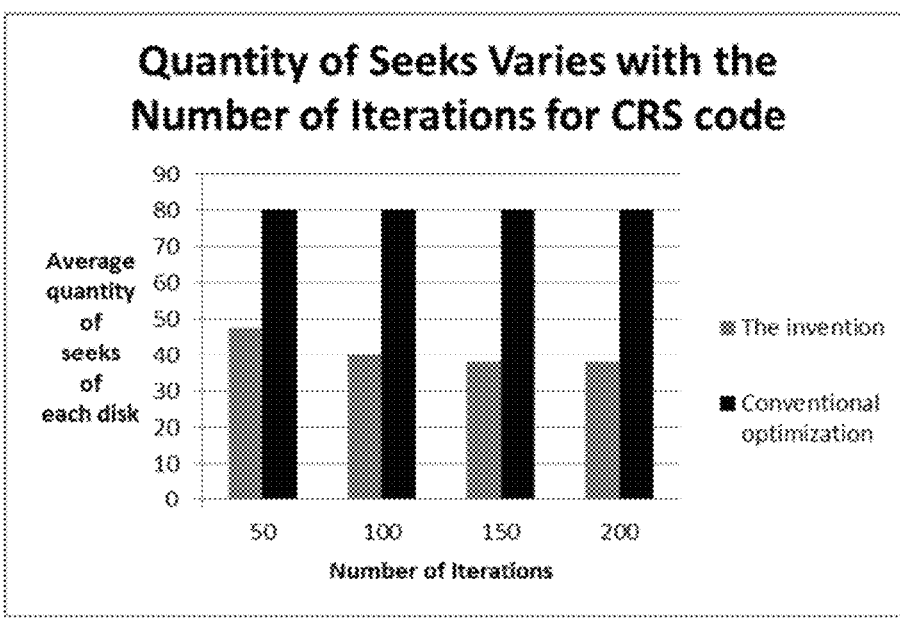

Specifically, when a disk failure occurs, a disk number of the failed disk is first determined; second, the amount of data allowed to be read in the disk recovery and the number of iterations are provided according to the system load status and a time limitation for recovering the system service; third, the related greedy algorithm is used, and for each failed element, an attempt is made to use possible parity chains thereof for recovery, and meanwhile a data padding solution is used; finally, on a premise that the system's requirement for the amount of read data is met during this iteration, a solution with the smallest quantity of seek operations in this iteration is selected. The iterative search is repeated until all iterations are complete. Referring to FIG. 5, based on the initial recovery policy in FIG. 4, FIG. 5 is a schematic diagram of parity chain replacement and distribution of read data after data padding is performed (assuming that a quantity of data elements that the system allows to read is 27 and the system selects an RDP code for fault tolerance). In this recovery solution, the amount of data is not greater than the amount of data that the system allows to read, and the quantity of seeks is smaller than the quantity of seeks in the previously found recovery solutions. In addition, the system reads needed data according to the optimal recovery solution that is found during the given number of iterations, and performs data recovery according to the decoding rule of the erasure code.

The optimization method according to the embodiment of the present invention is a new method for recovering a single-disk failure. Based on the tabu search algorithm, this method provides an algorithm for searching for a near-optimal recovery solution within polynomial time, which ensures high efficiency in searching for a solution. In addition, a tabu list is used to store local optimal solutions found during each iteration, so that the search process is guided toward a global optimal solution. Furthermore, a data padding method is used, which further reduces the quantity of seek operations during the single-disk recovery on a premise that the given amount of data that the system allows to read is met during recovery of a single-disk failure.

Further, by using several common erasure coding technologies proposed in this field, for example, RDP code, X code, STAR code, and CRS (Cauchy Reed-Solomon) code, single-disk recovery performance of the optimization method according to the embodiment of the present invention is tested when the optimization method uses the foregoing erasure coding technologies to protect data reliability. The components of the RDP code, the X code, and the STAR code are related to a prime number p; one stripe of the RDP code includes p+1 disks, one stripe of the X code includes p disks, and one stripe of the STAR code includes p+3 disks.

Specifically, an experimental environment includes a Linux server provided with an X5472 processor and an 8 GB memory and a disk array of 15 disks. The operating system running on the server is SUSE Linux Enterprise Server, and the file system is EXT3. The disk array includes 15 Seagate/Savvio disks, each of which has a 300 GB storage capacity and a disk rotation rate of 10,000 rotations per minute. The server and the disk array are interconnected by a fiber with a bandwidth of 800 MB/s. The encoding of the erasure code is implemented on the basis of an open-source software package Jerasure 1.2 widely applied in the academic field.

(1) Test on Optimization of the Quantity of Seeks Under Different Erasure Codes

Referring to FIG. 6, during the test, in a storage system using different erasure codes, data in a disk is deleted at random, and a single-disk failure recovery deciding module is invoked to select an optimal recovery solution that is found in different iterations, and a final result is obtained, as shown in FIG. 6. It can be seen that compared with the conventional optimization methods, the embodiment of the present invention can greatly reduce the quantity of seek operations on the tested four types of erasure codes. For example, for the RDP code, the embodiment of the present invention can reduce the quantity of seek operations by as much as 65.1%; for the STAR code, compared with the conventional optimization methods, the embodiment of the present invention can reduce the quantity of seek operations by as much as 64.7%.

(2) Comparison of Time Needed for Deciding the Solution for Recovering the Single-Disk Failure and Optimality The time needed for finding an optimal recovery solution is further tested. Different erasure coding solutions are selected, and the time needed by an enumeration method and the greedy algorithm provided by the embodiment of the present invention is tested when the quantity of stripes is equal to 1, 2, and 3; and a comparison is made between the optimality of optimal solutions found by using the two methods. The optimality is defined as a ratio of the quantity of seek operations needed by an optimal recovery solution that is found by using the greedy algorithm to the quantity of seek operations needed by an optimal solution that is found by using the enumeration method. The obtained final results are shown in Table 1.

TABLE 1

| Quantity of stripes | Optimality | Time (present invention) | Time (Enumeration method) |
|---|---|---|---|
| RDP code (p = 11, and the quantity of disks is 12) | | | |
| 1 | 1.00 | 0.04 second | 0.04 second |
| 2 | 1.00 | 0.12 second | 7.52 seconds |
| 3 | 1.00 | 0.21 second | 3 hours 17 minutes 30 seconds |
| X code (p = 11, and the quantity of disks is 11) | | | |
| 1 | 1.05 | 0.03 second | 0.04 second |
| 2 | 1.08 | 0.15 second | 26.04 seconds |
| 3 | 1.02 | 0.27 second | 20 hours 4 minutes 8 seconds |
| STAR code (p = 11, and the quantity of disks is 14) | | | |
| 1 | 1.00 | 0.21 second | 0.22 second |
| 2 | 1.09 | 0.29 second | 7 hours 1 minute 10 seconds |

It can be seen that the greedy algorithm provided by the embodiment of the present invention can find an optimal solution with a quantity of seek operations close to that of an optimal solution found by the enumeration algorithm, but the operation time needed by the greedy algorithm is far shorter than that needed by the enumeration algorithm. This also proves that the embodiment of the present invention has very good accuracy and efficiency.

Comparison between the amount of data needed by the optimal recovery solution found in the embodiment of the present invention and the amount of data needed by the optimal recovery solution found by using a conventional method for optimizing recovery of a single-disk failure:

During the test, the optimization method of the embodiment of the present invention is applied to four different erasure codes. For the RDP code, the X code, and the STAR code, the prime number p is set to 11 (In the three codes, the prime number is mainly used to set the quantity of disks included in one stripe). For the CRS code, k is set to 8, and m is set to 4. For the amount of data read during the recovery of a single-disk failure, mainly three methods for recovering a single disk are tested, namely, the optimization method of the embodiment of the present invention, a conventional optimization method, and a non-optimized method. The conventional optimization method only optimizes the amount of data to be read for recovery in a single stripe. The non-optimized method simply uses a kind of parity chain to recover all the lost data elements, and recovers the lost parity elements by using the corresponding parity chains. It is assumed that in the process of implementing the optimization method of the embodiment of the present invention, an upper threshold set by the system for the amount of data allowed to be read is 5% higher than that in the conventional optimization method, where the threshold may be selected adaptively according to the system load. For ease of representation, the amount of data read by the non-optimized method is standardized as 1. The test results are shown in Table 2.

TABLE 2

| Erasure code | Method of the present invention | Conventional optimization method | Non-optimized method |
|---|---|---|---|
| RDP code | 0.81 | 0.77 | 1.00 |
| X code | 0.76 | 0.72 | 1.00 |
| STAR code | 0.76 | 0.72 | 1.00 |
| CRS code | 0.91 | 0.87 | 1.00 |

It can be seen from the results that compared with the non-optimized method, the optimization method of the embodiment of the present invention can greatly reduce the amount of data read during the recovery. Compared with the conventional optimization method, the optimization method of the embodiment of the present invention needs to read a bit more data, but the proportion may be adjusted according to the system load status.

In conclusion, the embodiment of the present invention may be applicable to any XOR-based erasure code, and can find a near-optimal recovery solution within polynomial time in a multi-stripe condition. In the optimization method, calculation is first performed in each stripe according to the upper threshold set by the system for the amount of data that needs to be read, and a single-stripe solution is obtained. The purpose of the single-stripe solution is to optimize the amount of data that needs to be read in the single stripe to meet the limitation of the amount of data that the system allows to read. Then, a greedy algorithm is designed to build an initial solution in a multi-stripe environment on the basis of the existing single-stripe solution; a solution with the smallest quantity of seeks is selected in an iterative manner through selective transformation of the decoding rule on a premise that the requirement for the amount of data that the system allows to read is met, and the solution is set to an initial solution in the next iteration. Finally, a solution obtained after a certain number of iterations is selected as the final recovery solution, that is, the optimal recovery policy.

In the method for optimizing recovery of a single-disk failure according to the embodiment of the present invention, an issue of single-disk failure recovery is considered in a multi-stripe condition; the amount of data read during failure recovery is optimized, and the quantity of seek operations generated during the recovery is also optimized, which accelerates a process of recovering a single-disk failure and avoids using complicated algorithms that involve NP-hard problems and are previously used in a lot of methods. In addition, a decision on a recovery solution is made by using a principle that a near-optimal recovery solution is found within polynomial time. Therefore, the method is adaptive to a heterogeneous environment where system conditions are frequently changed. The method is capable of quickly finding a near-optimal solution applicable to this environment, for recovering a single-disk failure, can improve efficiency of recovering the single-disk failure, and has good universality, simplicity, and convenience, thereby better meeting a user requirement and improving user experience.

Figure 7:
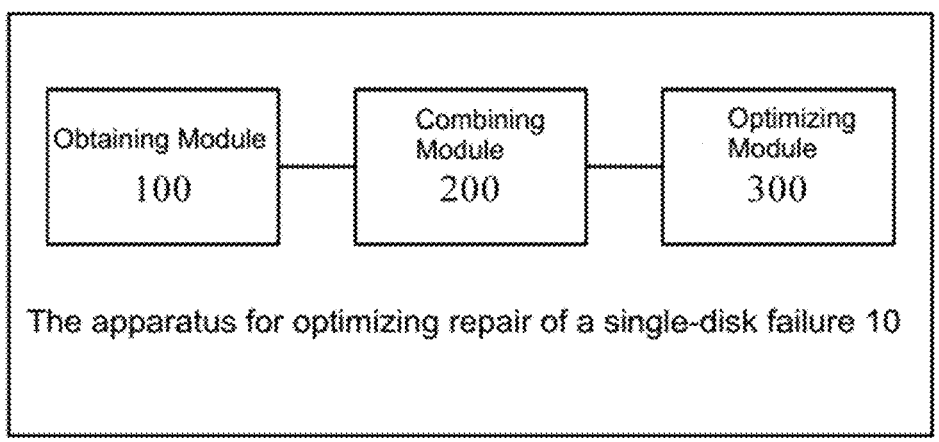
FIG. 7 is a schematic diagram of a structure of an apparatus for optimizing recovery of a single-disk failure according to an embodiment of the present invention.

Next, an apparatus for optimizing recovery of a single-disk failure according to an embodiment of the present invention is described with reference to an accompanying drawing. Referring to FIG. 7, the optimization apparatus 10 includes an obtaining module 100, a combining module 200, and an optimizing module 300.

The obtaining module 100 is configured to obtain, according to current load information of an erasure-coded storage system, an amount of data expected to be read and an allowed number of iterations. The combining module 200 is configured to obtain a recovery optimization policy for failed data in each single stripe of multiple stripes, and combine the recovery optimization policy for the failed data in each single stripe to obtain an initial recovery policy for the multiple stripes. The optimizing module 300 is configured to further optimize the initial recovery policy according to the amount of data expected to be read and the allowed number of iterations and by using a greedy algorithm based on tabu search to obtain an optimal recovery policy with a smallest quantity of seeks, so that the single-disk failure is recovered according to the optimal recovery policy. By using the optimization apparatus 10 according to the embodiment of the present invention, in a storage system, double optimization is implemented on an amount of data that needs to be read during the recovery of a single-disk failure and the quantity of seek operations generated during the recovery, thereby accelerating a process of recovering the single-disk failure.

Further, in an embodiment of the present invention, the recovery optimization policy is to read data from a single stripe according to the amount of data expected to be read and a decoding rule of an erasure code to recover failed data in the single stripe.

Further, in an embodiment of the present invention, the optimizing module 300 is further configured to: initialize a tabu list to an empty set, where the tabu list stores a quantity of seeks needed by an optimal solution that is found during each iteration; during each iteration, perform an input by using the optimal recovery solution in last iteration as the initial recovery policy in this iteration; and after the allowed number of iterations, select, from the tabu list, a solution with the smallest quantity of seeks as the optimal recovery policy.

Further, in an embodiment of the present invention, if the amount of data needed by the optimal recovery policy is smaller than the amount of data expected to be read, data padding is performed.

Further, in an embodiment of the present invention, the quantity of seeks includes the number of magnetic head rotations and preparations before the data is read, and the single stripe is a set of multiple data strips and corresponding parity strips generated by an erasure code.

It should be understood that a specific implementation process of the apparatus for optimizing recovery of a single-disk failure according to the embodiment of the present invention is the same as the working process of the method for optimizing recovery of a single-disk failure according to the embodiment of the present invention, and is not further described herein.

In the apparatus for optimizing recovery of a single-disk failure according to the embodiment of the present invention, an issue of single-disk failure recovery is considered in a multi-stripe condition; the amount of data read during failure recovery is optimized, and the quantity of seek operations generated during the recovery is also optimized, which accelerates a process of recovering a single-disk failure and avoids using complicated algorithms that involve NP-hard problems and are previously used in a lot of methods. In addition, a decision on a recovery solution is made by using a principle that a near-optimal recovery solution is found within polynomial time. Therefore, the apparatus is adaptive to a heterogeneous environment where system conditions are frequently changed, and is capable of quickly finding a near-optimal solution applicable to this environment for recovering a single-disk failure. Besides, the apparatus improves efficiency of recovering the single-disk failure, and has good universality, simplicity, and convenience, thereby better meeting a user requirement and improving user experience.

The description of any process or method that is in the flowchart or is described herein in any other manner may be understood as a representation including one or more modules, segments or parts of codes of executable instructions used to implement a specific logic function or steps of a process, and the range of preferred implementation manners of the present invention includes additional implementation.

A person skilled in the technical field of the embodiment of the present invention should understand that functions may not be executed in the illustrated or discussed sequence, which includes that involved functions are executed in a basically concurrent manner or in a reverse sequence.

Logics and/or steps represented in the flowchart or described herein in other manners, for example, a sequenced list of executable instructions that are considered as being used to implement the logic functions, may be specifically implemented in any computer readable medium, so that they are used by an instruction execution system, apparatus, or device (for example, a computer-based system, a system including a processor, or other systems that can fetch an instruction from the instruction execution system, apparatus, or device and execute the instruction) or are used in combination with the instruction execution system, apparatus, or device. In this specification, the "computer readable medium" may be an apparatus that may contain, store, communicate, spread, or transmit a program so that the program is used by the instruction execution system, apparatus, or device or is used in combination with the instruction execution system, apparatus, or device. More specific examples (a non-exhaustive list) of the computer readable medium include the following: an electrical connecting portion (an electronic device) having one or more cables, a portable computer disk enclosure (a magnetic device), a random access memory (RAM), a read-only memory (ROM), an erasable programmable read-only memory (EPROM or flash memory), an optical device, and a portable compact disc read-only memory (CDROM). In addition, the computer readable medium may even be a paper or another appropriate medium on which the program can be printed. This is because, for example, the program may be obtained in an electronic manner by optically scanning, editing, and interpreting the paper or another medium or processing the paper or another medium in other appropriate manners if necessary, and then the program is stored in the computer memory.

It should be understood that all parts of the present invention may be implemented by using hardware, software, firmware, or a combination thereof. In the foregoing implementation manners, multiple steps or methods may be implemented by using software or firmware that is stored in a memory and is executed by an appropriate instruction execution system. For example, if the multiple steps or methods are implemented by using hardware, as in another implementation manner, any one of the following known technologies or a combination thereof may be used for implementation: a discrete logic circuit having a logic gate circuit configured to implement a logic function for a data signal, an application specific integrated circuit having an appropriate combinational logic gate circuit, a programmable gate array (PGA), and a field programmable gate array (FPGA).

A person of ordinary skill in the art can understand that all or some of the steps in the foregoing method embodiments may be implemented by related hardware instructed by a program. The program may be stored in a computer readable storage medium. When the program is executed, one of the steps of the foregoing method embodiments or a combination thereof is involved.

In addition, functional units in the embodiments of the present invention may be integrated into one processing module, or each of the units may exist alone physically, or two or more units are integrated into one module. The integrated module may be implemented in a form of hardware, or may be implemented in a form of a software functional module. If implemented in the form of a software functional module and sold or used as an independent product, the integrated module may also be stored in a computer readable storage medium.

The foregoing storage medium may be a read-only memory, a disk, or an optical disc.

In the descriptions of the specification, descriptions with reference to terms "an embodiment", "some embodiments", "example", "specific example", or "some examples" shall mean that a specific feature, a structure, a material, or a characteristic described with reference to the embodiment or the example is included in at least one embodiment or example of the present invention. In the specification, exemplary descriptions of the foregoing terms may not refer to a same embodiment or a same example. In addition, the described specific feature, structure, material, or characteristic may be combined in one or multiple embodiments or examples in an appropriate manner.

Although the embodiments of the present invention have been illustrated and described hereinbefore, it may be understood that the foregoing embodiments are exemplary only and should not be understood as limitations on the present invention. A person of ordinary skill in the art may make modifications, replacements, and variations to the foregoing embodiments without departing from the spirit and principle of the present invention.

We claim:

1. A method for optimizing recovery of a failure of a single-disk, comprising:
   using a processor of a computer system to execute the following steps:
   obtaining, according to current load information of an erasure-coded storage system comprising a first disk and a second disk, an amount of data expected to be read and an allowed number of iterations, wherein the first disk comprises a first portion and a second portion, and the second disk comprises a third portion and a fourth portion, the first portion and the third portion store failed data in a first stripe, and the second portion and the fourth portion store failed data in a second stripe;
   obtaining a recovery optimization policy for the failed data in each single stripe of the first stripe and the second stripe, and combining the recovery optimization policy for the failed data in the each single stripe to obtain an initial recovery policy for the first stripe and the second stripe;
   further optimizing the initial recovery policy by using a greedy algorithm based on tabu search, subject to the amount of data expected to be read and the allowed number of iterations, to obtain an optimal recovery policy with a smallest quantity of seeks, so that the failure of the single-disk is recovered according to the optimal recovery policy; wherein the step of optimizing the initial recovery policy by using a greedy algorithm based on tabu search, subject to the amount of data expected to be read and the allowed number of iterations, to obtain an optimal recovery policy with a smallest quantity of seeks, further comprises:
   initializing a tabu list to an empty set, wherein the tabu list stores a quantity of seeks needed by an optimal solution that is found during each iteration; during each iteration, performing an input by using the optimal recovery solution in a last iteration as the initial recovery policy in the current iteration; and after the allowed number of iterations, selecting a solution with the smallest quantity of seeks from the tabu list to serve as the optimal recovery policy; and
   recovering the failure of the single-disk according to the optimal recovery policy,
      wherein the optimal recovery policy is to read data from the each single stripe according to the amount of data expected to be read and a decoding rule of an erasure code to recover the failed data stored in the each single stripe, and
      wherein to read the data from the each single stripe, the following steps further comprise rotating a magnetic head of the single-disk to a position where the data resides.

2. The method for optimizing recovery of a failure of a single-disk according to claim 1, wherein if the amount of data needed by the optimal recovery policy is smaller than the amount of data expected to be read, data padding is performed.

3. The method for optimizing recovery of a failure of a single-disk according to claim 1, wherein the quantity of seeks comprises the number of magnetic head rotations and preparations before the data is read, and the single stripe is a set of multiple data strips and corresponding parity strips generated by an erasure code.

4. A non-transitory computer readable medium having stored thereon executable instructions that when executed by one or more processors of a computer system, cause the computer system to
   obtain, by an obtaining module, according to current load information of an erasure-coded storage system comprising a first disk and a second disk, an amount of data expected to be read and an allowed number of iterations, wherein the first disk comprises a first portion and a second portion, and the second disk comprises a third portion and a fourth portion, the first portion and the third portion store failed data in a first stripe, and the second portion and the fourth portion store failed data in a second stripe;
   obtain, by a combining module, a recovery optimization policy for the failed data in each single stripe of the first stripe and the second stripe,
   combine, by the obtaining module, the recovery optimization policy for the failed data in each single stripe to obtain an initial recovery policy for the first stripe and the second stripe; and further optimzied, by an optimizing module, the initial recovery policy by using a greedy algorithm based on tabu search, subject to the amount of data expected to be read and the allowed number of iterations, to obtain an optimal recovery policy with a smallest quantity of seeks, so that the single-disk failure is recovered according to the optimal recovery policy; wherein the optimizing module is further configured to:
   initialize a tabu list to an empty set, wherein the tabu list stores a quantity of seeks needed by an optimal solution that is found during each iteration;
   during each iteration, perform an input by using the optimal recovery solution in a last iteration as the initial recovery policy in the current iteration; and after the allowed number of iterations, select a solution with the smallest quantity of seeks from the tabu list to serve as the optimal recovery policy; and
   recovering the failure of the single-disk according to the optimal recovery policy,
      wherein the optimal recovery policy is to read data from the each single stripe according to the amount of data expected to be read and a decoding rule of an erasure code to recover the failed data stored in the each single stripe, and wherein to read the data from the each single stripe, the executable instructions further cause the computer system to rotate a magnetic head of the single-disk to a position where the data resides.

5. The non-transitory computer readable medium of claim 4, wherein the executable instructions cause-the computer system to further perform a data padding, by the optimizing module, if the amount of data needed by the optimal recovery policy is smaller than the amount of data expected to be read.

6. The non-transitory computer readable medium of claim 4, wherein the quantity of seeks comprises the number of magnetic head rotations and preparations before the data is read, and the each single stripe is a set of multiple data strips and corresponding parity strips generated by an erasure code.

* * * * *